(12) United States Patent
Linnerbauer

(10) Patent No.: US 10,608,376 B2
(45) Date of Patent: Mar. 31, 2020

(54) MECHANISM FOR SECURING A CONNECTOR DEVICE TO A MATING CONNECTOR DEVICE

(71) Applicant: ODU GmbH & Co. KG, Mühldorf (DE)

(72) Inventor: Horst Linnerbauer, Hunding Ortsteil Kieflitz (DE)

(73) Assignee: ODU GMBH & CO. KG, Mühldorf (DE)

( * ) Notice: Subject to any disclaimer, the term of this patent is extended or adjusted under 35 U.S.C. 154(b) by 0 days.

(21) Appl. No.: 16/189,332

(22) Filed: Nov. 13, 2018

(65) Prior Publication Data

US 2019/0148881 A1 May 16, 2019

(30) Foreign Application Priority Data

Nov. 14, 2017 (DE) .......................... 10 2017 126 720

(51) Int. Cl.
*H01R 13/62* (2006.01)
*H01R 13/629* (2006.01)
(Continued)

(52) U.S. Cl.
CPC ....... *H01R 13/62938* (2013.01); *F16B 17/00* (2013.01); *G01R 1/04* (2013.01);
(Continued)

(58) Field of Classification Search
CPC .......... H01R 13/62938; H01R 12/7058; H01R 13/518; H01R 13/6292
(Continued)

(56) References Cited

U.S. PATENT DOCUMENTS 3,122,603 A    2/1964  Atkinson
4,213,666 A *  7/1980  Braginetz ........ H01R 13/62905
                                             439/341
(Continued)

FOREIGN PATENT DOCUMENTS

CN    103573764 A    2/2014
DE    37 27 200 A1   2/1989
(Continued)

*Primary Examiner* — Alexander Gilman
(74) *Attorney, Agent, or Firm* — Birch, Stewart, Kolasch & Birch, LLP

(57) ABSTRACT

A mechanism for securing a connector device and a mating connector device to one another and for releasing them from one another, the mechanism having at least one catch arranged on the connector device and a drive with a shaft, the rotation of which is capable of moving the catch to and fro between an open position and a locking position of the catch. The mechanism is constructed such that, during travel between the open position and the locking position, the catch performs a combined pivoting and translational movement, and/or a translational movement on a curved path. The mechanism has a slotted link with a link guide and a link block, wherein the link guide is arranged on the catch and the link block lies on the axis of the shaft or is formed by the shaft. The drive has a crank drive for converting the rotation of the shaft into a movement of the catch between the open position and the locking position and the mechanism has a second slotted link for guiding the catch, wherein a link block of the second slotted link is formed by part of a connecting rod shaft on the catch side with which a connecting rod of the crank drive is coupled to the catch. The catch takes the form of a toggle lever. Furthermore, a connector device with the mechanism and a system consisting of a connector device with a mechanism and a mating connector device having at least one mating catch.

15 Claims, 16 Drawing Sheets

(51) Int. Cl.
*H01R 13/518* (2006.01)
*F16B 17/00* (2006.01)
*G01R 1/04* (2006.01)
*H01R 12/70* (2011.01)

(52) U.S. Cl.
CPC ....... *H01R 12/7058* (2013.01); *H01R 13/518* (2013.01); *H01R 13/62922* (2013.01); *H01R 2201/20* (2013.01)

(58) Field of Classification Search
USPC ........................................................ 439/352
See application file for complete search history.

(56) References Cited

U.S. PATENT DOCUMENTS

| | | | | |
|---|---|---|---|---|
| 4,329,005 A * | 5/1982 | Braginetz | ................ | G01R 1/04 439/51 |
| 4,704,882 A * | 11/1987 | Takasaki | ............. | E05B 65/0053 292/173 |
| 4,804,335 A * | 2/1989 | Pennington | .......... | H01R 13/629 439/377 |
| 5,575,163 A * | 11/1996 | Kohl | ....................... | B60R 11/02 248/27.3 |
| 5,620,213 A * | 4/1997 | Ellis | ........................ | E05B 13/10 292/100 |
| 5,633,597 A * | 5/1997 | Stowers | ............. | G01R 1/06722 324/754.11 |
| 5,942,906 A * | 8/1999 | Stowers | ............. | H01R 13/2421 324/750.25 |
| 6,203,076 B1 * | 3/2001 | Wytcherley | ............... | E05B 7/00 292/197 |
| 6,824,405 B2 * | 11/2004 | Hubbard | .......... | H01R 13/62933 439/136 |
| 6,957,979 B2 * | 10/2005 | Welsh | .................. | H05K 7/1409 439/545 |
| 7,016,199 B2 * | 3/2006 | Burgers | ................... | G01R 1/04 361/759 |
| 2010/0254106 A1 * | 10/2010 | Graybill | ............... | H05K 7/1489 361/760 |
| 2014/0003863 A1 * | 1/2014 | Zabielski | ................ | F16B 17/00 403/322.4 |

FOREIGN PATENT DOCUMENTS

| | | |
|---|---|---|
| DE | 20 2005 005 753 U1 | 8/2005 |
| GB | 2241278 A | 8/1991 |
| GB | 2305784 A | 4/1997 |
| JP | S52-163795 U | 12/1977 |
| JP | 2004-199907 A | 7/2004 |
| KR | 10-2010-01107037 A | 10/2010 |
| RU | 2106729 C1 | 3/1998 |

* cited by examiner

MECHANISM FOR SECURING A CONNECTOR DEVICE TO A MATING CONNECTOR DEVICE

FIELD OF THE INVENTION

The invention relates to a mechanism for securing a connector device and a mating connector device to one another and for releasing them from one another, the mechanism having at least one catch arranged on the connector device and a drive which is capable of moving the catch to and fro between an open position and a locking position of the catch. The invention further relates to a connector device featuring such a mechanism. The invention finally also relates to a system consisting of the connector device featuring the mechanism and a mating connector device which has at least one mating catch.

BACKGROUND OF THE INVENTION

U.S. Pat. No. 7,016,199 B2 discloses a receiver for receiving and securing an interchangeable test adapter. At the right-hand and left-hand edges thereof, it has in each case a slotted link plate with two slotted links which can be raised and lowered with the assistance of a manually actuated lever mechanism. In order to secure the interchangeable test adapter, roller journals of the interchangeable test adapter are inserted into corresponding grooves of the receiver in such a manner that they may be guided in the slotted links of the slotted link plates. The slotted link plates are then moved upwards by actuating the lever mechanism, whereby the roller journals and, together therewith, the interchangeable test adapter are moved towards the receiver and secured. A similar mechanism is known from U.S. Pat. No. 6,824,405 B2.

A similar manually actuated catch system in which the journals are first held against the frame of an interchangeable test adapter by the displacement of a slotted link, then drawn against the force of the contacts towards the receiver and finally secured in an end position is also known from U.S. Pat. No. 4,329,005 A.

U.S. Pat. No. 5,633,597 A discloses a variant of the above-stated mechanisms. The receiver here comprises a lower and an upper frame part, wherein the interchangeable test adapter can be secured to the upper frame part with the assistance of a bayonet mechanism. The upper frame part can then be drawn against the lower frame part via slotted link plates and link blocks by manual actuation of a lever. This mechanism is also described in U.S. Pat. No. 5,942,906 A.

U.S. Pat. No. 4,804,335 A discloses a system for connecting and disconnecting one or more banks of electrical connectors to or from the conductor tracks of printed circuit cards which are supported at an opening in a mainframe card cage. The system comprises a frame assembly mounted in the card cage, a retractable supporting element borne by the frame assembly element and arms borne by the frame assembly which may be moved to and fro between a first and a second position in order to move the supporting elements out of the frame and into the frame. The system moreover has one or more modules with banks of electrical connectors, wherein the modules are removably attached to the supporting element in such a manner that the electrical connectors are aligned with the conductor tracks of the printed circuit cards in the card cage and are connected therewith when the arms are moved from the first into the second position. For the purposes of moving the supporting elements, the arms in part take the form of toothed racks into which a gearwheel respectively engages which can be set in rotation via a lever and a further toothed rack/gearwheel combination.

U.S. Pat. No. 4,213,666 A discloses a manually actuated mechanism in which a test adapter is secured to a receiver with the assistance of an eccentric which is arranged on a shaft rotatable by manual actuation.

OBJECT OF THE INVENTION

The object of the present invention is to provide an improved mechanism for securing a connector device and a mating connector device to one another and for releasing them from one another, the mechanism having at least one catch arranged on the connector device and a drive which is capable of moving the catch to and fro between an open position and a locking position of the catch. A further object of the invention is to provide an improved connector device and an improved system consisting of a connector device and a mating connector device. Further advantages of the invention which can be achieved are indicated below in connection with the discussion of the features of the invention.

SOLUTION ACCORDING TO THE INVENTION

The reference signs in all the claims have no limiting effect, but rather are merely intended to improve the clarity thereof.

The stated object is achieved by a mechanism for securing a connector device and a mating connector device to one another and for releasing them from one another, the mechanism having at least one catch arranged on the connector device and a drive which is capable of moving the catch to and fro between an open position and a locking position of the catch, wherein the mechanism is constructed such that, during travel between the open position and the locking position, the catch performs a combined pivoting and translational movement, and/or a translational movement over a curved path.

A "connector device" for the purposes of the present invention is a device which comprises at least one connector, preferably a plurality of connectors, which is/are provided for interaction with a mating connector in order to produce an electrical and/or a fluid connection and/or a fibre-optic connection. A "mating connector device" for the purposes of the present invention is accordingly a device which comprises at least one mating connector which is provided for interaction with the connector in order to produce an electrical or a fluid connection or a fibre-optic connection.

The connector(s) of a preferred connector device and or the mating connector(s) of a preferred mating connector device are at least in part, preferably in their entirety, connectors or mating connectors for producing an electrical plug connection. A connector may for example be a pin which interacts with a socket as mating connector or conversely a socket which interacts with a pin as mating connector.

For the purposes of the present invention, "securing" means that the connector device and mating connector device are connected together by being secured in a manner in which they can be released from one another again. Securing preferably fixes the connector device in position relative to the mating connector device. Securing preferably produces a connection between the connectors and mating connectors of the connector device and mating connector device which were previously disconnected from one another. Similarly, releasing the connector device and mating connector device from one another preferably disconnects the connectors and mating connectors of the connector device and mating connector device.

The feature that the catch performs the movement "during travel between the open position and the locking position" means that it performs said movement either during travel from the open position into the locking position and/or during travel from the locking position into the open position. In a preferred embodiment of the invention, the catch performs the movement both during travel from the locking position into the open position and during travel from the locking position into the open position.

With regard to the feature of the combined pivoting and translational movement, the pivoting movement and the translational movement may take place simultaneously, in succession or partly simultaneously and partly in succession. The invention also comprises embodiments in which a plurality of separate pivoting and/or translational movements are performed during travel between the open position and the locking position. The feature of the combined "pivoting and/or translational movement" should therefore merely be taken to mean that it excludes mechanisms in which only one or more pivoting movements or one or more translational movements are performed both during travel from the open position into the locking position and during travel from the locking position into the open position.

The alternative or additional feature of the translational movement on a curved path does not require all the travel between locking position and open position to be curved. Instead, curvature over only a portion of the travel in one or both ways from the locking position into the open position or conversely from the open position into the locking position is sufficient.

Thanks to the combined pivoting and/or translational movement or indeed also translation over a curved path, it is straightforwardly possible to obtain a mechanism which reliably secures the mating connector device to the connector device. In particular, it is possible to ensure that the mating catch of the mating connector device can be reliably gripped by the pivoting movement or the translation over part of the curved path, specifically even when the connector device and mating connector device are not yet exactly aligned with one another.

It is also possible to ensure by the translational movement that the mating connector device and the connector device can simply be drawn towards one another in order to bring together the connector and mating connector to produce the plug connection.

The stated object is moreover achieved by a mechanism for securing a connector device and a mating connector device to one another and for releasing them from one another, wherein the mechanism has at least one catch arranged on the connector device and a drive with a shaft, the rotation of which is capable of moving the catch to and fro between an open position and a locking position of the catch. The mechanism moreover has a slotted link with a link guide and a link block, wherein the link guide is arranged on the catch and the link block lies on the axis of the shaft or is formed by the shaft itself. This embodiment of the invention permits a particularly simple and compact design of the mechanism according to the invention.

The object of the invention is also achieved by a mechanism for securing a connector device and a mating connector device to one another and for releasing them from one another, wherein the mechanism has at least one catch arranged on the connector device and a drive with a shaft, the rotation of which is capable of moving the catch to and fro between an open position and a locking position of the catch. The drive here has a crank drive for converting the rotation of the shaft into a movement of the catch between the open position and the locking position. The mechanism moreover has a second slotted link for guiding the movement of the catch between the locking position and the open position, wherein a link block of the second slotted link is formed by part of a connecting rod shaft on the catch side with which a connecting rod of the crank drive is coupled to the catch.

"Second slotted link" does not here mean that the mechanism necessarily also has to have another, first slotted link in addition to the second slotted link. Instead, the designation "second slotted link" merely serves to distinguish it from a "first slotted link" which likewise occurs in embodiments of this invention.

The object is further achieved by a mechanism for securing a connector device and a mating connector device to one another and for releasing them from one another, the mechanism having at least one catch arranged on the connector device and a drive which is capable of moving the catch to and fro between an open position and a locking position of the catch. The catch here has a claw for engaging with a mating catch of the mating connector device and, in relation to the longitudinal extent thereof, is guided at at least two different points in each case by one or more journals. The position, again in relation to the longitudinal extent of the catch, of the or at least one of the plurality of journals changes during travel between the open position and the locking position, such that there is a change in the ratio of the length of a lever on the claw side, which lever is formed by the portion of the catch between the claw and the journal closest to the claw, to the length of a lever remote from the claw, which lever is formed by the portion of the catch between said journal and the journal further away from the claw. One achievable advantage of this embodiment of the invention is that, in the locking position of the catch, the connector device and mating connector device are particularly reliably secured to one another.

The object of the invention is finally achieved by a connector device featuring the mechanism and by a system consisting of the connector device featuring the mechanism and a mating connector device which has at least one mating catch.

PREFERRED EMBODIMENTS OF THE INVENTION

Advantageous developments and further developments, which may be used individually or in combination, constitute the subject matter of the dependent claims and the following description.

During travel from the open position into the locking position the catch preferably performs a combined pivoting and translational movement, and/or a translational movement over a curved path. In addition or alternatively, during travel from the locking position into the open position the catch preferably performs a combined pivoting and translational movement, and/or a translational movement over a curved path.

A preferred catch is provided with a claw, which for securing may engage with a mating catch of the mating connector device. The preferred claw comprises two fingers, which form a recess between them in which the mating catch may be received during securing. To this end, the fingers are preferably spaced apart from one another in the plug-in direction. The preferred claw is arranged in such a way on the catch that in the locking position of the catch the recess extends substantially perpendicular to the direction of the translational component of the movement of the catch during travel between the open position and the locking position. The recess preferably extends substantially perpendicular to the plug-in direction.

As is explained in greater detail below with reference to preferred exemplary embodiments, the preferred catch is guided, in relation to the longitudinal extent thereof, at at least two different points in each case by one or more journals. In this case, the catch preferably takes the form of a toggle lever in that the position of the journal or of at least one of the journals, again relative to the longitudinal extent of the catch, changes during travel between the open position and the locking position, such that there is a change in the ratio of the length of a lever on the claw side, which lever is formed by the portion of the catch between the claw and the journal closest to the claw, to the length of a lever remote from the claw, which is formed by the portion of the catch between said journal and the journal further away from the claw. This ratio drops particularly preferably during travel between the open position and the locking position of the catch. One achievable advantage of this embodiment of the invention is that, in the locking position of the catch, the connector device and a mating connector device are particularly reliably secured to one another. The preferred journals are link blocks of a first and/or a second slotted link.

A preferred mechanism has a plurality of catches, particularly preferably according to one of the embodiments of the catch described herein, which may be moved to and fro between the respective open position thereof and the respective locking position thereof. One achievable advantage of this embodiment of the invention is that the connector device and the mating connector device may be secured to one another by the plurality of catches at a plurality of points. This advantageously makes it possible for the locking forces acting between connector device and mating connector device to be divided between the catches and for the force acting on a respective individual catch and corresponding mating catch to be reduced. In this way, each individual catch and/or the part of the mechanism moving the catch may be of lighter construction; bent sheet metal parts may for example also be used. In this way, the manufacturing costs of the mechanism may be reduced. At the same time, this embodiment of the invention enables the reliability of the mechanism to be increased, for example because a plurality of catches makes reliable securing possible even if an individual catch fails. During travel from its open position to its locking position and/or from its locking position to its open position, each of these catches preferably performs a combined pivoting and translational movement.

In one preferred embodiment of the invention, the mechanism is constructed such that the pivoting movement of the catch proceeds about a pivot axis which extends substantially perpendicular to the plug-in direction. For the purposes of the present invention, the "plug-in direction" is the direction in which connector device and mating connector device have to be brought together in order to produce the electrical connection and/or the fluid connection and/or the fibre-optic connection. One achievable advantage of this embodiment of the invention is that a shaft for bringing about the pivoting movement of the catch may likewise extend perpendicular to the plug-in direction and thus as a rule in a plane of the plug-in face of the connector device This allows the construction of the mechanism according to the invention to be particularly simple and compact. A particularly preferred embodiment of the invention comprises a plurality of catches, wherein the pivoting movement of each of these catches proceeds substantially perpendicular to the plug-in direction.

A preferred drive of the mechanism according to the invention comprises a shaft, the rotation of which is capable of moving the catch to and fro between the open position and the locking position of the catch. In this case, the rotation is preferably a rotation about only part of a full revolution of the shaft. The rotation of the shaft for moving the catch between the open position and the locking position and/or between the locking position and the open position is preferably half (180°) a full revolution or less, particularly preferably a third (120°) of a full revolution or less, for example approximately a quarter (90°) of a full revolution.

In one particularly preferred embodiment of the invention, multiple catches are driven by the same shaft. The shaft is in turn preferably driven by an electric motor. Alternatively, the shaft may also be hand-actuated, for example driven by a hand lever. In the case of an electrically driven shaft, one or more switches, for example momentary-contact switches, are preferably provided on the connector device in order to operate the motor to move the catch from the locking position into the open position and/or from the open position into the locking position.

The drive preferably comprises a crank drive for converting the rotation of the shaft into movement of the catch between the open position and the locking position. The preferred crank drive comprises a crank arm arranged on the shaft. A further preferred crank drive comprises a connecting rod, which is coupled on the one hand to the crank arm and on the other hand to the catch. In this way, the rotational motion of the shaft may advantageously be simply converted into a translational component of the catch.

A preferred mechanism comprises a plurality of catches, wherein at least two catches are driven by the same crank drive. In one particularly preferred embodiment of the mechanism, precisely two catches are driven by the same crank drive. One particularly preferred embodiment of the mechanism contains an even number of catches, for example two, four, six, eight, ten, twelve or 24 catches, which are each driven in pairs by the same crank drive. In this case, the catches are preferably situated on opposite sides of the crank drive. The two catches are particularly preferably coupled to the connecting rod of the crank drive by way of a common connecting rod shaft on the catch side. The claws of the catches of one catch pair preferably point either in the same or in opposing directions.

The preferred drive comprises a first slotted link for guiding the catch. "First slotted link" here does not mean that the mechanism has also to comprise another, second slotted link in addition to the first slotted link. Instead, the designation "first slotted link" merely serves to distinguish it from a "second slotted link" which may likewise occur in embodiments of the invention. The first slotted link advantageously permits simple guidance of the catch movement between the locking position and the open position. A preferred first slotted link comprises a link guide which may take the form, for example, of one or more elongate holes, slots, grooves or ribs. Moreover, a preferred slotted link comprises a link block, which is guided in the link guide.

In a preferred link guide, the first slotted link is arranged on the catch. In this case, the catch preferably takes the form of a metal sheet and the link guide is an elongate hole in said metal sheet.

The link block of the first slotted link preferably lies on the axis of the shaft or is formed by the shaft. Particularly preferably, the link block is formed by a bush, which is arranged non-rotatably on the shaft. A preferred link block is formed in one piece with the crank arm of the crank drive.

The drive of a preferred embodiment of the invention comprises a second slotted link for guiding the movement of the catch between the locking position and the open position. The mechanism particularly preferably comprises a first and a second slotted link. The link block of the second slotted link is preferably formed by a part of the connecting rod shaft on the catch side, with which shaft a connecting rod of the crank drive is coupled to the catch. This enables the drive according to the invention to have a particularly simple structure.

A preferred second slotted link comprises a link guide which may take the form, for example, of one or more elongate holes, slots, grooves or ribs. It preferably takes the form of a slot in one or each of a plurality of metal sheets. In one embodiment of the invention, in which a crank drive is associated with a pair of catches, an elongate hole, slot, groove or rib is preferably located as part of the link guide on the side of each catch remote from the lever.

In one embodiment of the invention, the profile of the link guide of the first and/or second slotted link is partially or completely curved. This makes it particularly simple to achieve a combined pivoting and translational movement of the catch. In one embodiment of the invention, the link guide of the first and/or second slotted link is straight at least in places. This enables linear movement of the catch to be simply achieved. In one embodiment of the invention, the link guide of the first and/or second slotted link is curved at least in places. This enables pivoting movement of the catch to be simply achieved. The catch particularly preferably performs its pivoting movement about the link block of the first slotted link or of the second slotted link.

A preferred mechanism according to the invention has a plurality of shafts, for example two, three or four shafts. Each shaft is preferably provided with at least one, particularly preferably an even number of catches, for example two, four, six, eight, ten, or twelve catches. Particularly preferably, each pair of catches, as described above, is provided in each case with a crank drive, such that the two catches of a pair are driven by the same crank drive. The multiple shafts are preferably driven jointly by an electric motor or are hand-actuated, for example by a hand lever. To this end, the shafts are particularly preferably connected together in geared manner. In one alternative embodiment of the invention, each shaft is operated by its own electric motor or its own hand-actuating mechanism, for example by its own hand lever.

In one preferred embodiment of the invention, at least one catch, preferably a plurality of catches, is/are arranged in each case at at least one edge and preferably at two edges of the connector device. One, particularly preferably a plurality of the above-described pairs of catches is/are preferably arranged at the edge or edges. In the case of a connector device with edges of different lengths, the edges are preferably the longer edges. To drive the catches, a shaft is preferably arranged on the edge or edges provided with catches. All the catches located on the same side of the connector device are preferably driven by the same shaft. In the case of a connector device with edges of different lengths, the shaft preferably extends parallel to the longer edges.

In one embodiment of the invention, at least one catch and preferably a plurality of catches is/are arranged not at an edge but rather between the edges, i.e. in the facial plane of the connector device. One, particularly preferably a plurality of the above-described pairs of catches is/are preferably arranged in the facial plane of the connector device. The plurality of catches are preferably driven by the same shaft. In the case of a connector device with edges of different lengths, the shaft preferably extends parallel to the longer edges.

The preferred connector device is a receiver or an interchangeable test adapter for a mass interconnect, wherein the receiver or the interchangeable test adapter comprises the mechanism. The preferred receiver according to the invention comprises a receiver frame for receiving at least one, preferably a plurality of generally interchangeable modules, which comprise connectors or mating connectors for connection respectively with one or more mating connectors or connectors of the interchangeable test adapter. The latter mating connectors or connectors are preferably parts of modules of the interchangeable test adapter, wherein each module particularly preferably corresponds with a module received in the receiver in such a way that, when operated as intended, the (mating) connector of the module of the interchangeable test adapter is connected with the corresponding (mating) connector of the module received in the receiver. In the same way, a preferred interchangeable test adapter comprises a module receiving frame for receiving at least one, preferably a plurality of, interchangeable modules which each comprise a (mating) connector for connection with one or more connectors of the receiver. The mechanism according to the invention is preferably arranged on the frame of a receiver or an interchangeable test adapter. Receivers and interchangeable test adapters of interconnects have frequently to be secured to one another and released again from one another. Moreover, they frequently contain a large number of connectors or mating connectors, which have to be connected reliably together. The invention is therefore particularly advantageous in such instances of use.

For the purposes of the present invention, a "mass interconnect" is a connector interface for connecting one or more test instruments with one or more test objects (the test object in this connection is also known as Device Under Test (DUT), or Unit Under Test (UUT)). The preferred mass interconnect is part of automatic test equipment (also known as ATE), comprising a mass interconnect and one or more test instruments. The ATE may also comprise one or more PCs (personal computers) for controlling the test instrument(s). Preferably, one or more of the test instruments comply with one or more of the following specifications: PXI (PCI eXtensions for Instrumentation), VXI (VME eXtensions for Instrumentation), LXI (LAN eXtensions for Instrumentation), GPIB (General Purpose Interface Bus), SCXI (Signal Conditioning Extension for Instrumentation), PCI (Peripheral Component Interconnect).

For the purposes of the present invention, a "receiver" is the component of the mass interconnect which may be connected with an interchangeable test adapter (or ITA), so as to connect the test adapter to the test instrument(s). For the purposes of the present invention, an "interchangeable test adapter" is the component of the mass interconnect which may on the one hand be interchangeably connected with the receiver and on the other hand with the actual test object(s) generally interchangeable on the interchangeable test adapter, in order to connect the test object via the interchangeable test adapter and the receiver to the test instrument(s).

The preferred system, consisting of a connector device featuring the mechanism and a mating connector device, is a system comprising a receiver of a mass interconnect as the connector device and an interchangeable test adapter of a mass interconnect as the mating connector device or conversely an interchangeable test adapter of a mass interconnect as the connector device and a receiver of a mass interconnect as the mating connector device. The mating catch interacts with the catch of the mechanism in such a way that, in the locking position of the catch, the interchangeable test adapter is secured to the receiver.

BRIEF DESCRIPTION OF THE DRAWINGS

Further advantageous configurations are described in greater detail below with reference to multiple exemplary embodiments illustrated schematically in the drawings, to which the invention is however not limited and in which.

DETAILED DESCRIPTION OF EMBODIMENTS OF THE INVENTION

In the description given below of preferred embodiments of the present invention, the same reference signs denote the same or comparable components.

Figure 1:
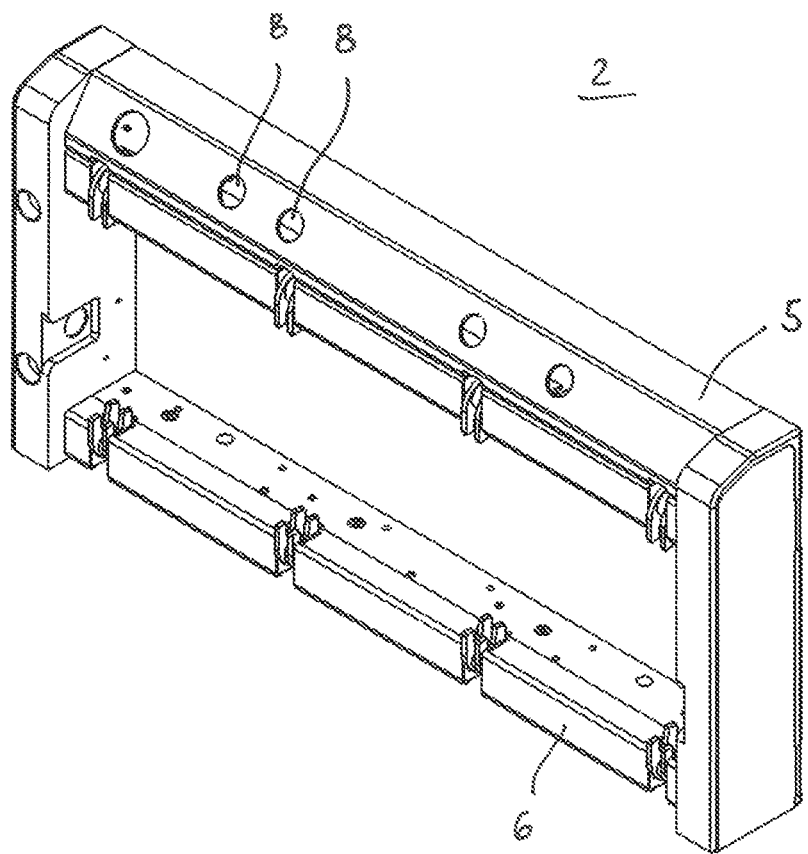
FIG. 1 shows a receiver frame featuring a mechanism according to the invention consisting respectively of four pairs of catches on the upper and lower longitudinal sides of the receiver frame.
Figure 2:
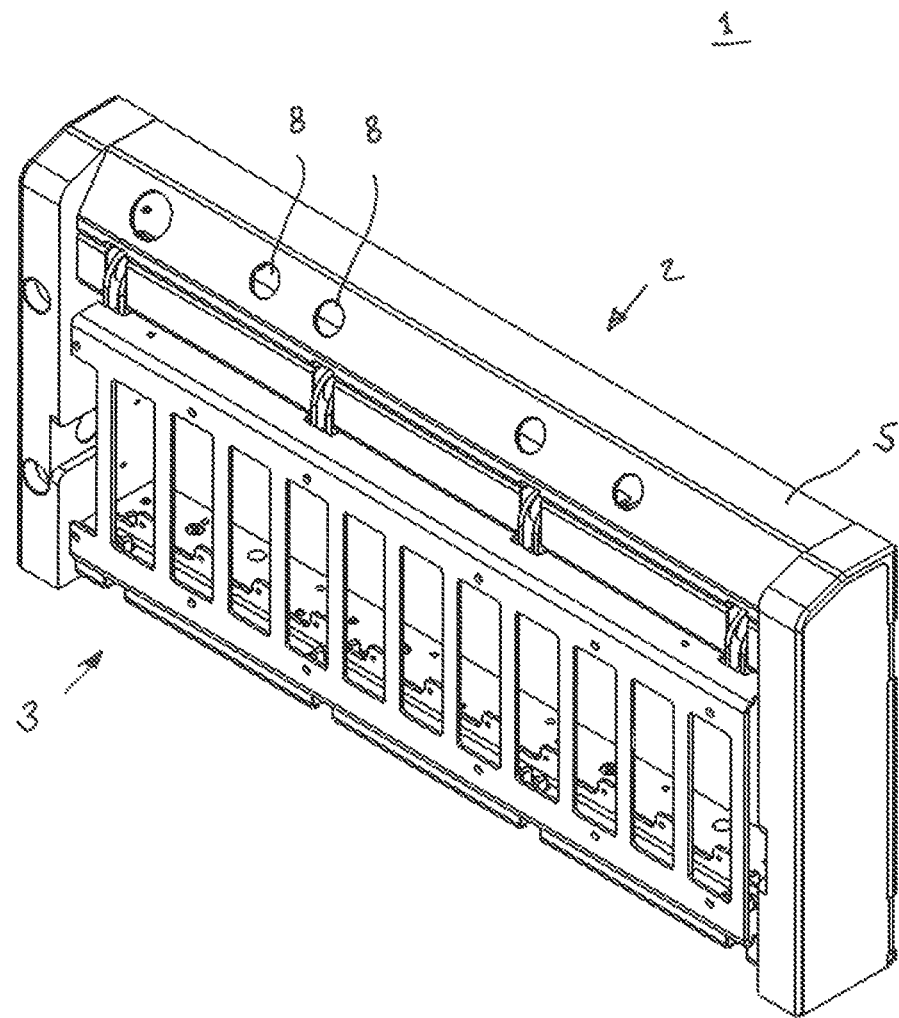
FIG. 2 shows the receiver frame of FIG. 1 to which the frame of an interchangeable test adapter has been secured by the catch.
Figure 3:
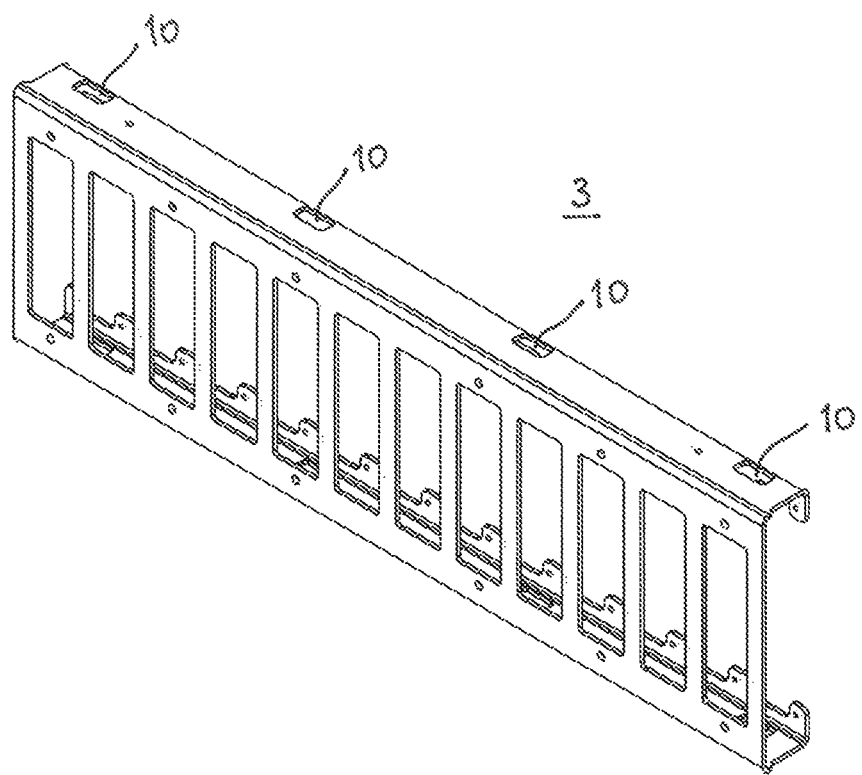
FIG. 3 shows the frame of the interchangeable test adapter of FIG. 2.
Figure 4:
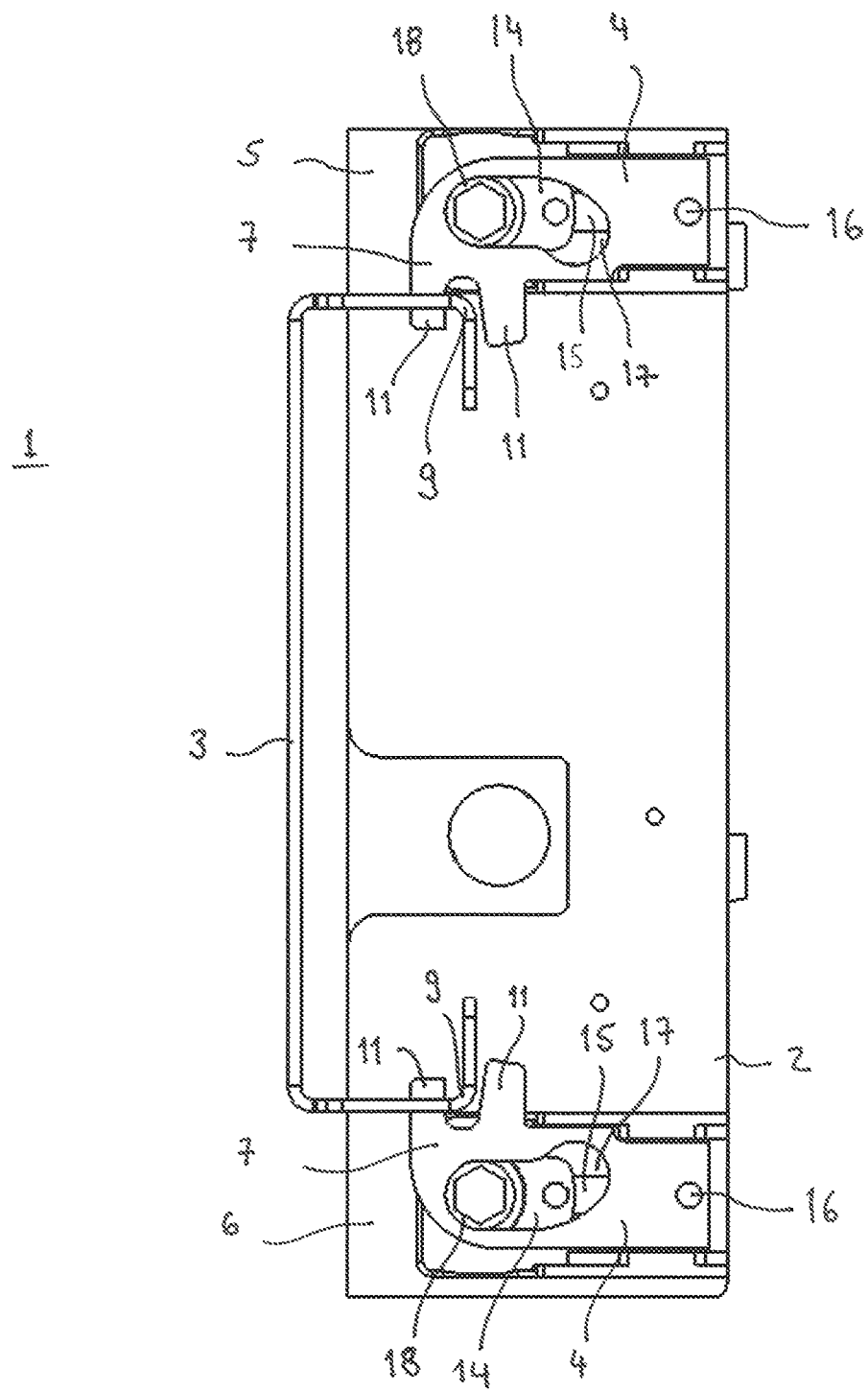
FIG. 4 shows a vertical cross-section through the depicted combination of receiver frame and interchangeable test adapter frame of FIG. 2.
Figure 5:
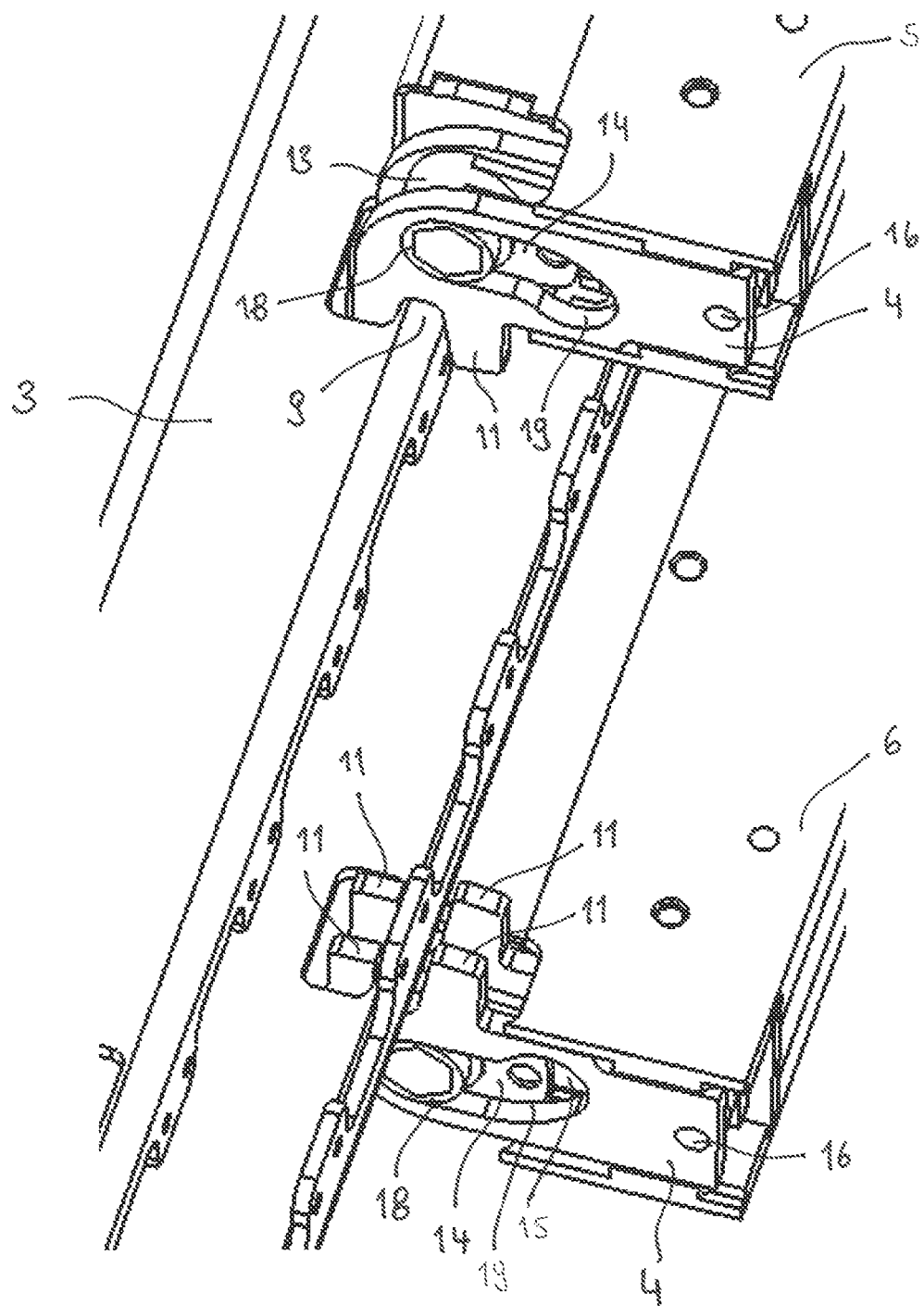
FIG. 5 shows a perspective elevational depiction corresponding to FIG. 4.
Figure 6:
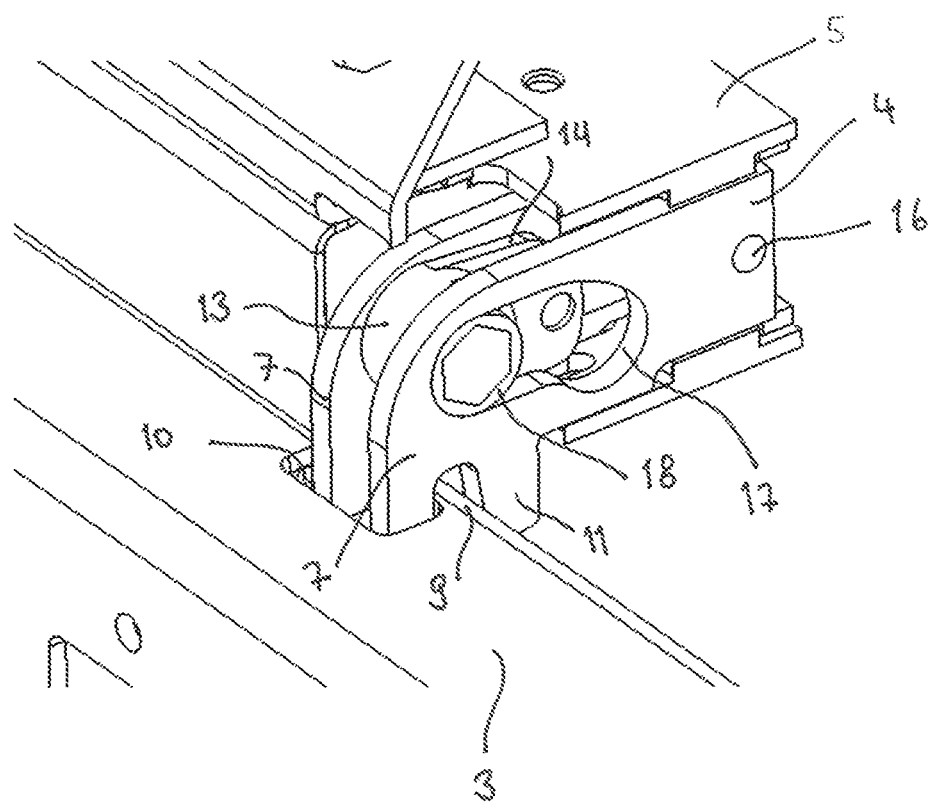
FIG. 6 shows a perspective elevational depiction showing a pair of catches engaging in a mating catch.
Figure 7:
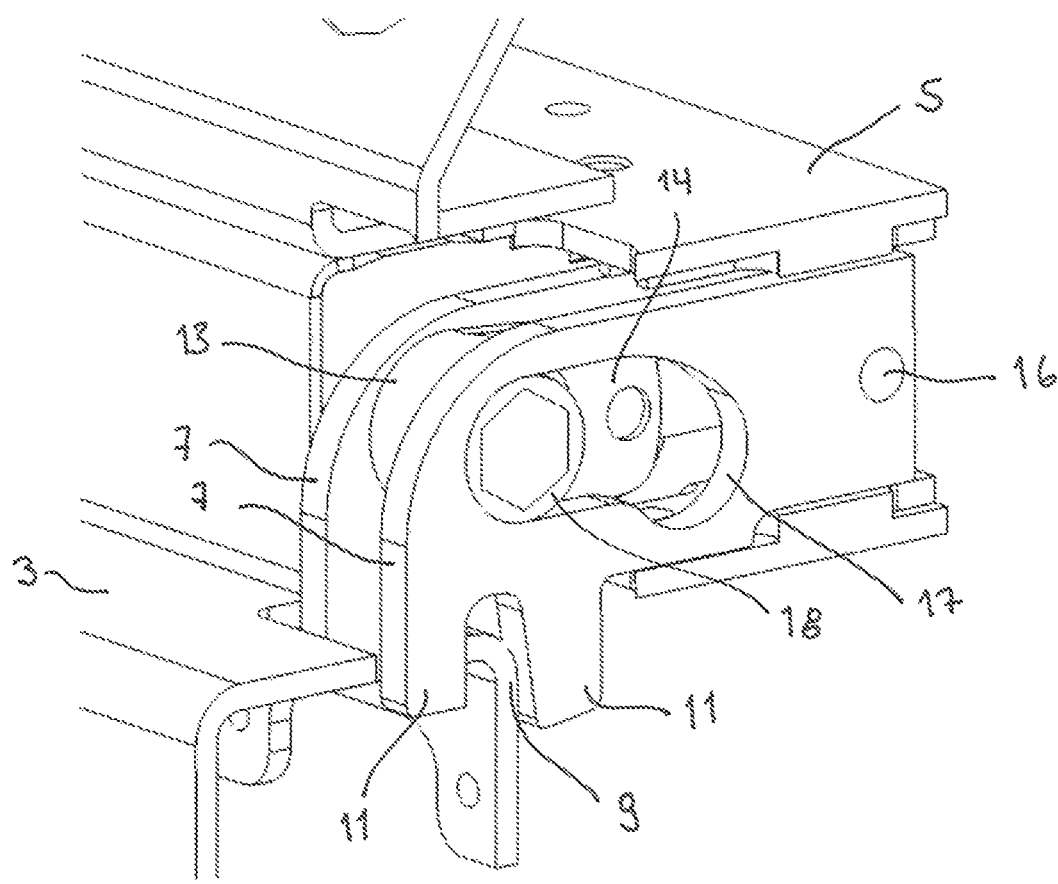
FIG. 7 shows a perspective elevational depiction of a pair of catches locked together with a mating catch.
Figure 8:
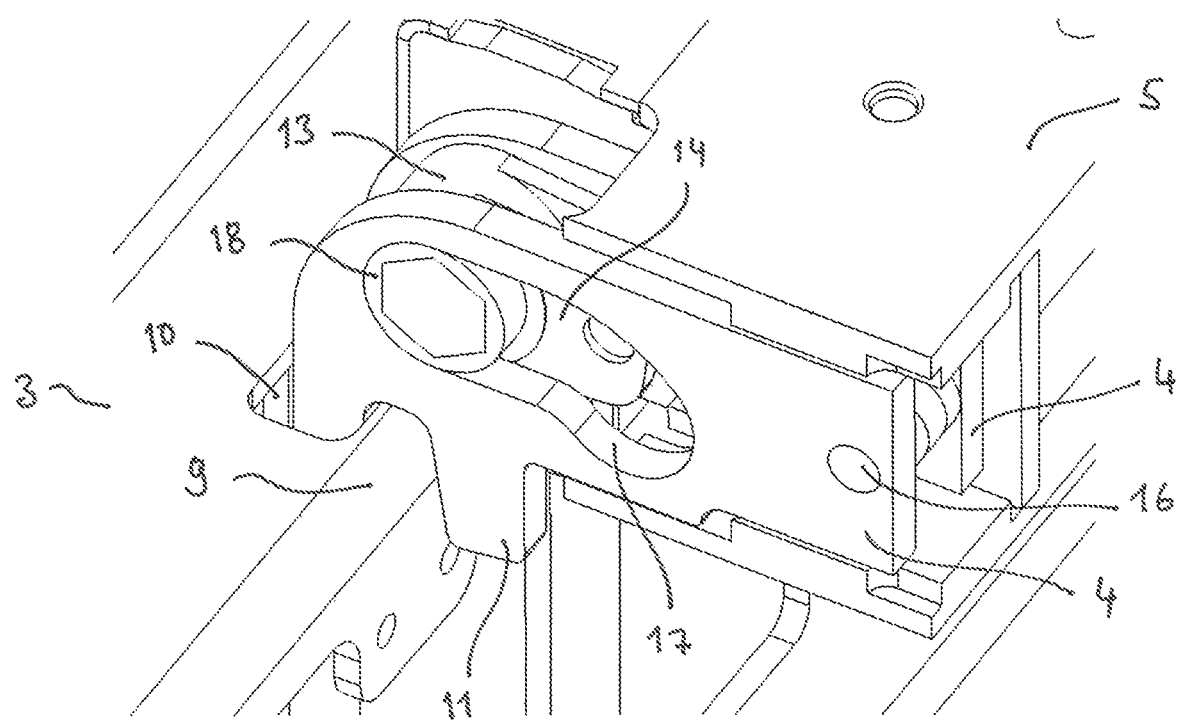
FIG. 8 shows a perspective elevational depiction of a pair of catches locked together with a mating catch.
Figure 9:
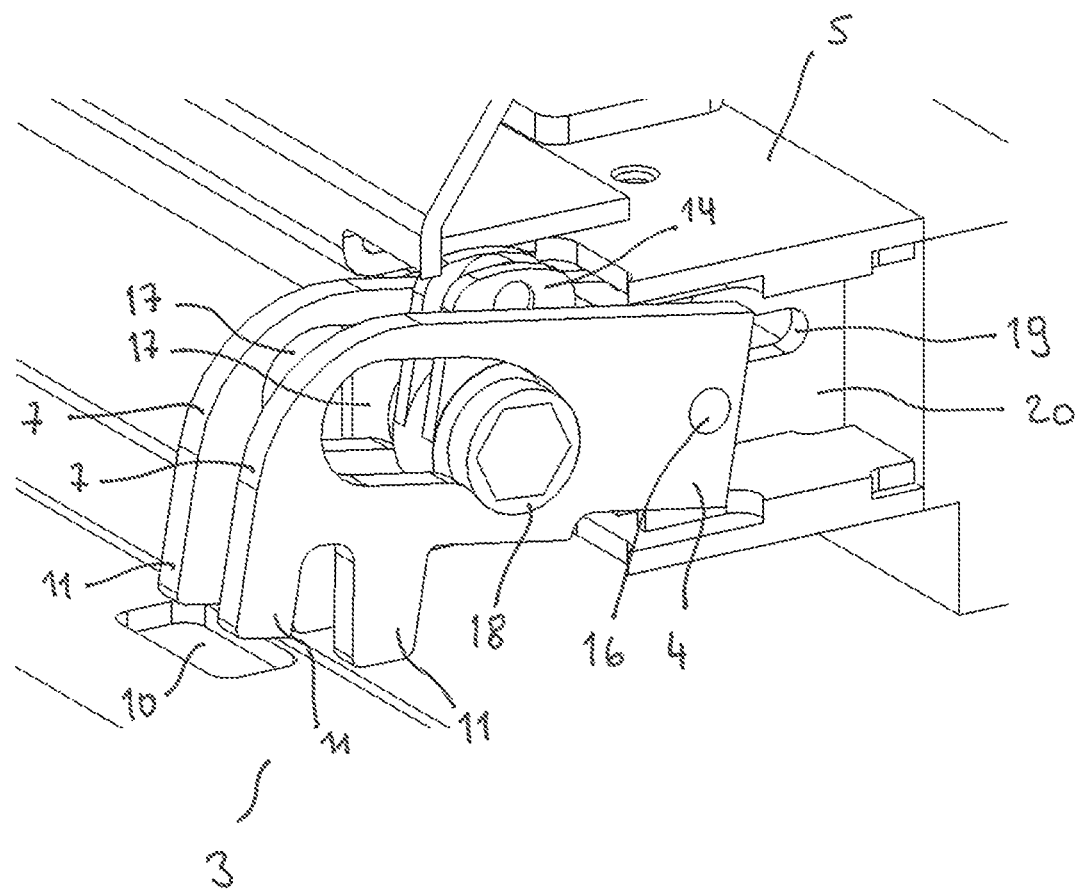
FIG. 9 shows a perspective elevational depiction of a pair of catches in the unlocked state.

The figures show various views of a mechanism 1 for securing a connector device in the form of a receiver and a mating connector device in the form of an interchangeable test adapter to one another and releasing them from one another. FIGS. 1 and 2 show the receiver frame 2, into which a plurality of modules with connectors may be releasably inserted. FIGS. 2 and 3 show the frame 3 of the interchangeable test adapter, into which may be inserted a plurality of modules with mating connectors which correspond to the connectors of the receiver. The interchangeable test adapter may be drawn in the plug-in direction towards the receiver and secured thereto using catches 4, which are arranged on the receiver. As a result of this drawing effect, contact may be established between the previously disconnected connectors and corresponding mating connectors.

To this end, the catches 4 may be moved from an open position, in which the interchangeable test adapter may be released from the receiver, into a locking position, in which the interchangeable test adapter is secured to the receiver, and also back from the locking position into the open position, wherein the catches 4 in each case perform a combined pivoting and translational movement. In FIGS. 1, 2, 4 to 8, 14 and 16 the catches 4 are depicted in their locking position and in FIGS. 9, 10, 13 and 15 in their open position. It is clear therefrom that the pivoting movement of each catch 4 proceeds about a pivot axis which extends substantially perpendicular to the plug-in direction.

As is clear from FIGS. 1 to 3, both the receiver frame 2 and the frame 3 of the interchangeable test adapter have longer upper 5 and lower 6 edges and shorter side edges. Four pairs of catches 4 are arranged respectively on the upper 5 and lower 6 edges, wherein the claws 7, described in greater detail below, as a rule point in each case towards the opposing edge 5, 6. In an alternative embodiment of the invention, which is not shown, a further row of catches 4, preferably pairs of catches, e.g. 4 pairs of catches, is arranged, preferably around half way, between the upper 5 and lower 6 edges, wherein in each pair of catches one claw 7 preferably points towards the upper edge 5 and another towards the lower edge 6.

Each row of catches 4 is driven by a shaft which is not shown in the figures, and therefore in FIGS. 1 and 2 one shaft is located in the upper receiver edge 5 and a further shaft in the lower receiver edge 6. By means of a gear unit, these two shafts are jointly driven by an electric motor, which is likewise not shown in the figures, in order to move them from the open position into the locking position and vice versa. In this respect, rotation of the shaft by a quarter of a full revolution moves the catches 4 from the open position into the locking position or vice versa. At holes 8 depicted in FIGS. 1 and 2 in the upper edge of the receiver frame, switches which are not depicted in the figures are arranged for operating the electric motor so that it moves the catches 4 between the open position and the locking position.

Each catch has one claw 7, with which it may engage a mating catch 9 on the frame of the interchangeable test adapter. The mating catch 9 takes the form of a web, which is formed by a through-hole 10 at the edge of the frame 3 of the interchangeable test adapter. The claw has two fingers 11, one finger 11 of which engages in the through-hole 10, such that the claw 7 may receive the mating catch in a recess 12 between the fingers 11. The recess 12 extends perpendicular to the plug-in direction.

Figure 10:
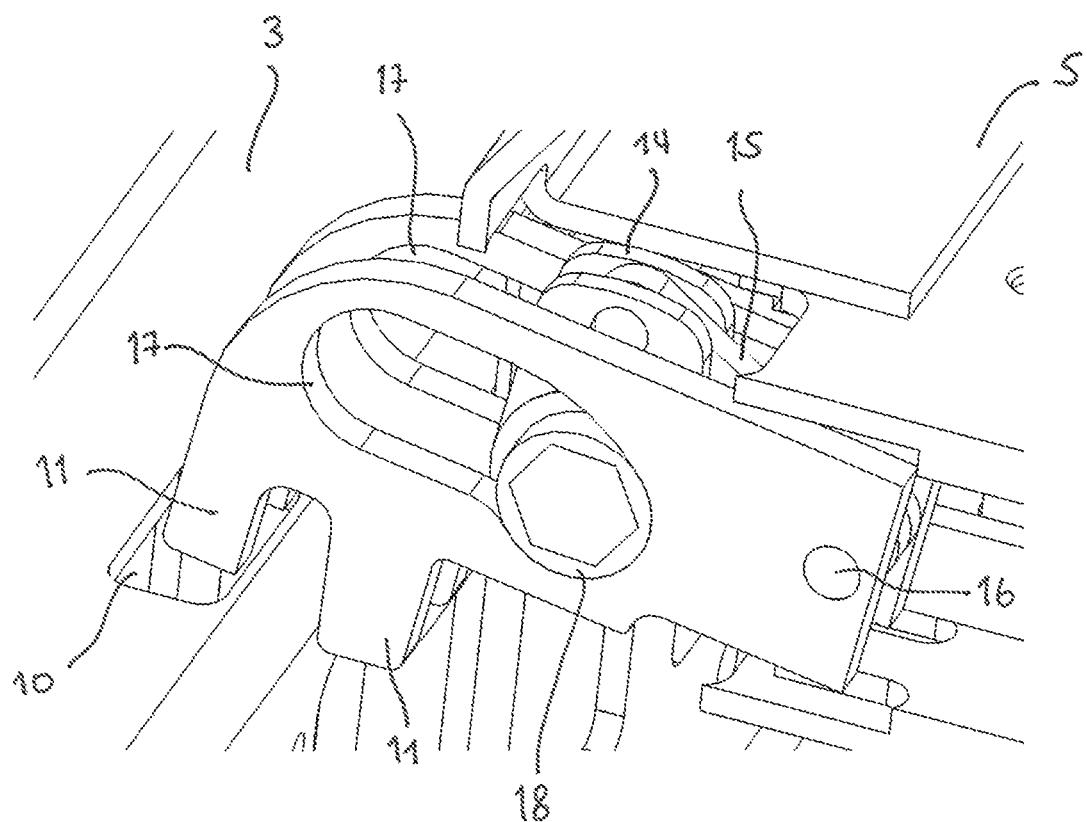
FIG. 10 shows an elevational depiction of the pair of catches of FIG. 9 from another perspective.
Figure 11:
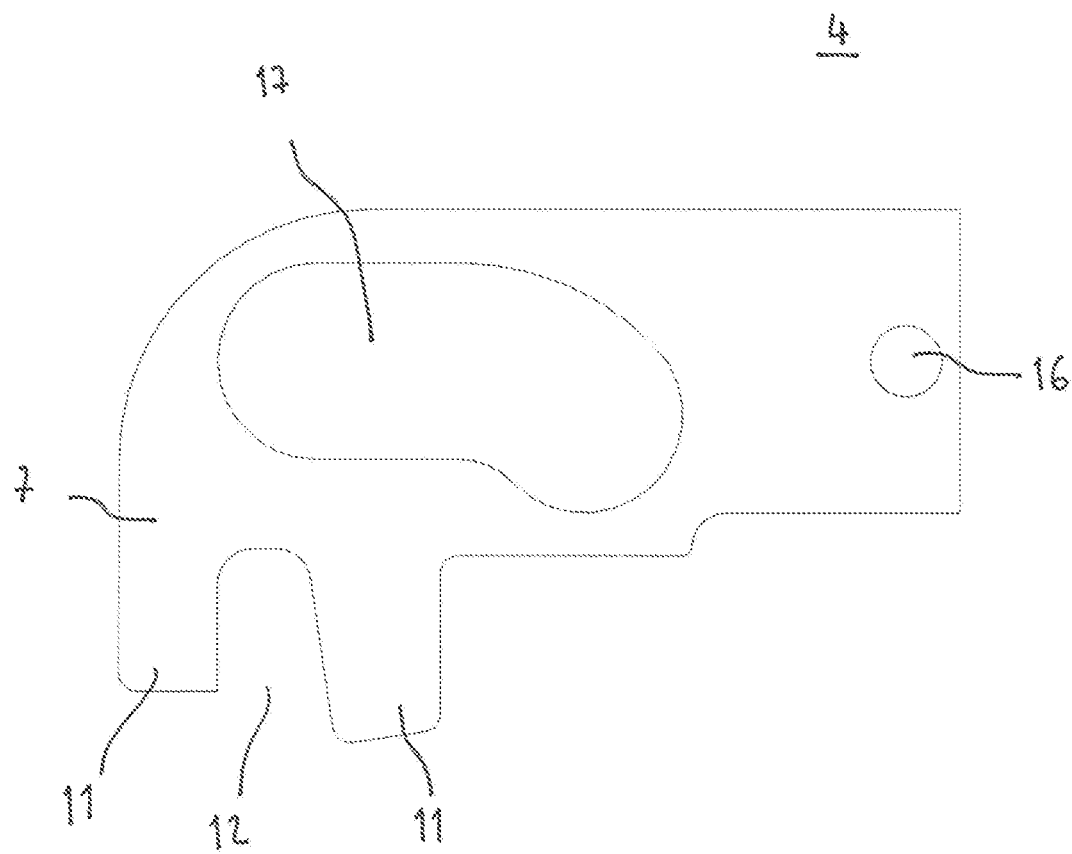
FIG. 11 is a plan view of a catch.
Figure 12:
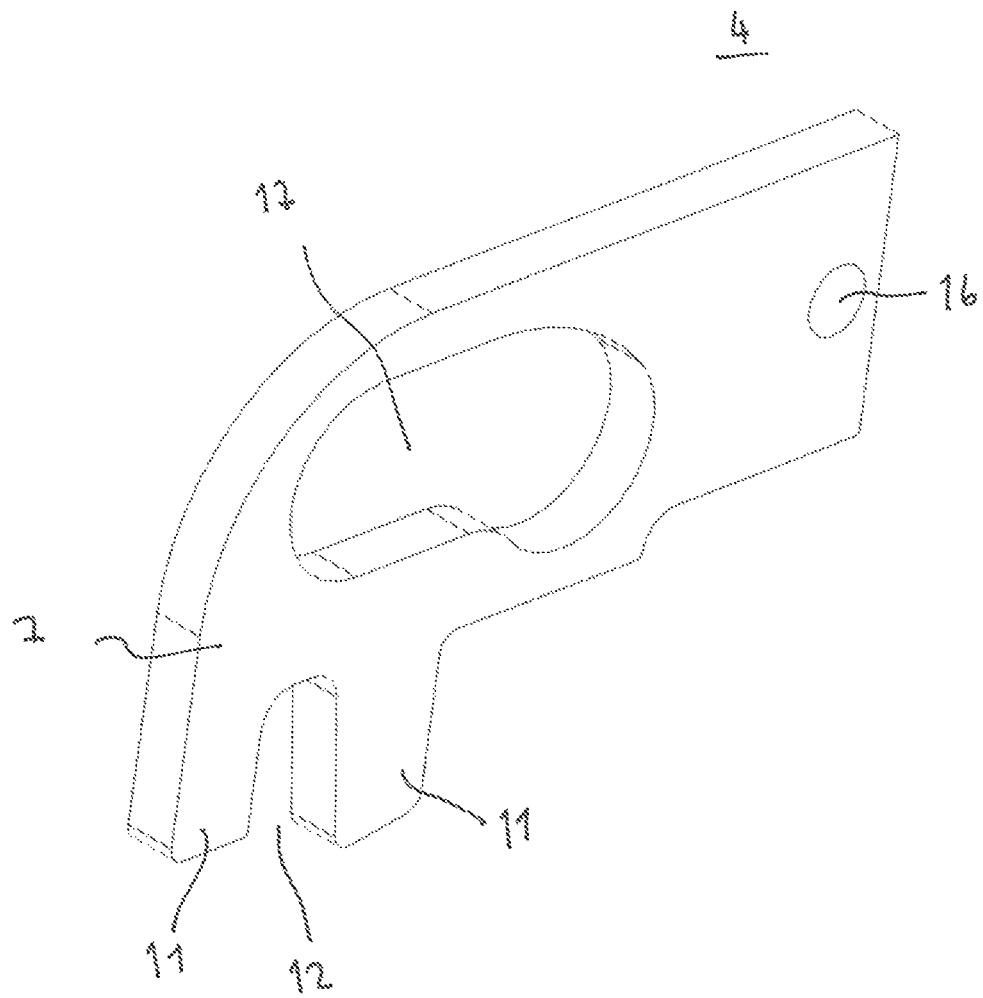
FIG. 12 is a perspective view of the catch of FIG. 11.
Figure 13:
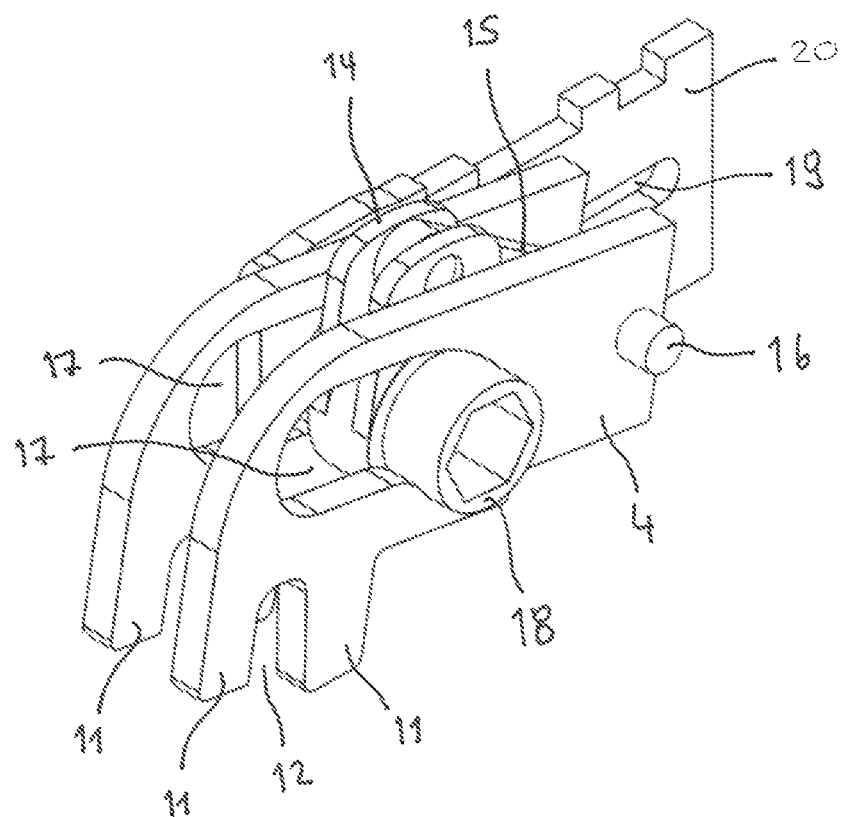
FIG. 13 shows a perspective depiction of a pair of catches and parts of the drive in the unlocked state.
Figure 14:
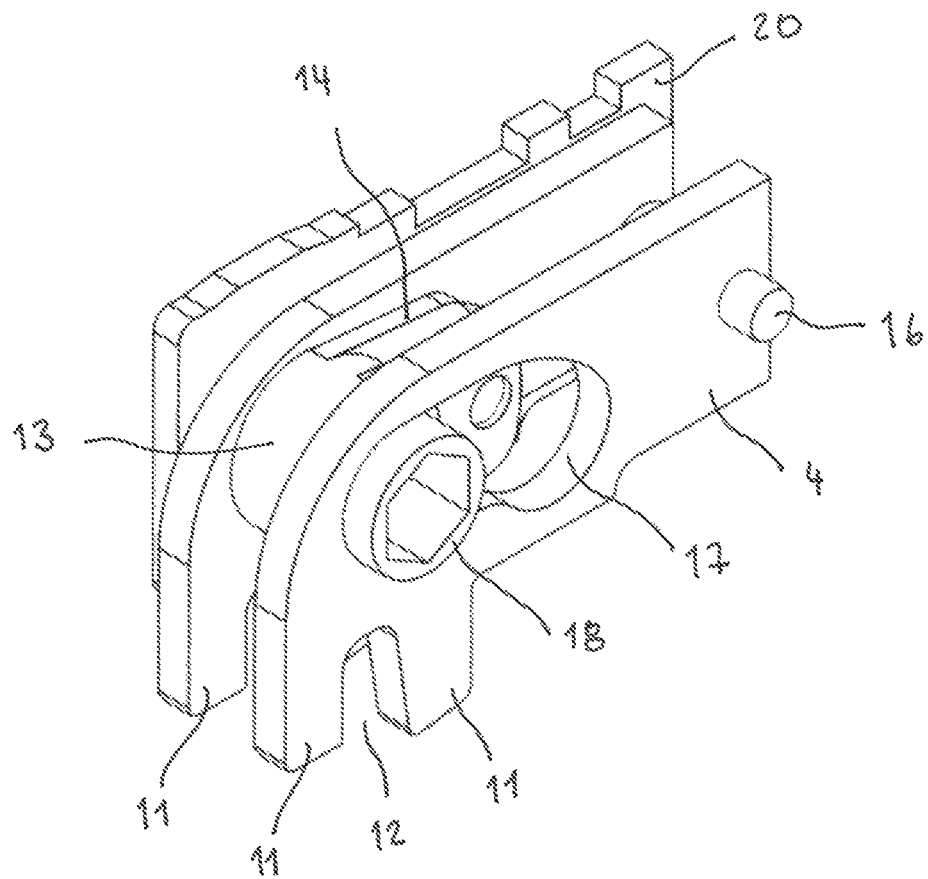
FIG. 14 shows a perspective depiction of the pair of catches of FIG. 13 in the locked state.
Figure 15:
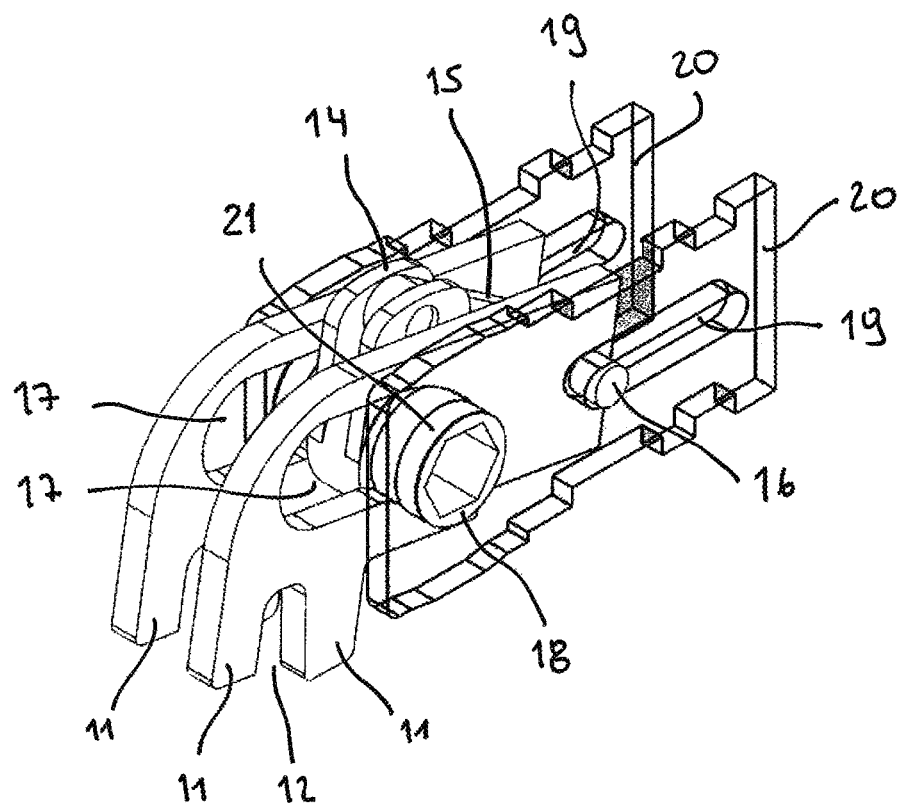
FIG. 15 shows the pair of catches in the unlocked state shown in FIG. 13 with bilateral second link guide in the unlocked state.
Figure 16:
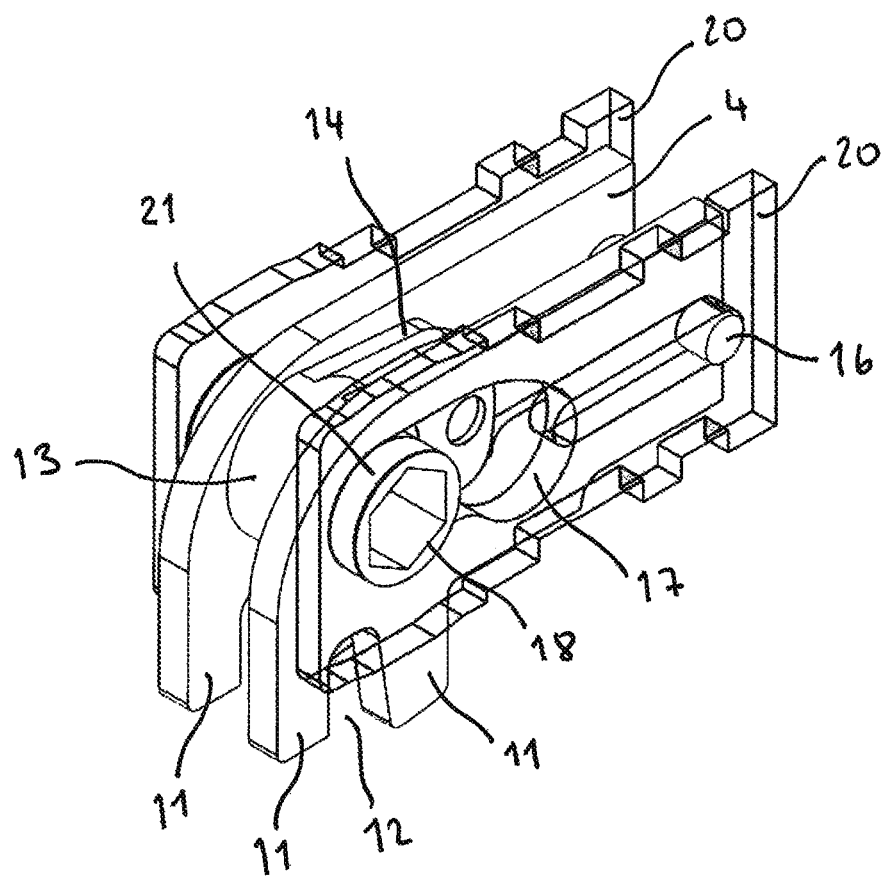
FIG. 16 shows the pair of catches in the locked state of FIG. 14 with bilateral link guide in the locked state.

As is clear from FIGS. 10, 13 and 14, the drive of the catch 4 has a crank drive, for converting the rotation of the shaft into movement of the catch between the open position and the locking position. To this end, the crank drive comprises a bush 13, which is arranged non-rotatably on the shaft, not shown, as a result of having a hexagonal through-hole which corresponds with a hexagonal shaft cross-section. As an alternative to the hexagonal shape, if the shaft is suitably shaped, then a tooth-shaped hole, spline shaft hole or square hole or a hole with a groove for a feather key are also for example feasible for mounting the bush non-rotatably on the shaft.

A crank arm 14, to which a connecting rod 15 is coupled with a pin, is arranged on the bush 13. The connecting rod 15 drives two catches 4 located on opposing sides of the crank drive, due to being coupled thereto by means of a connecting rod shaft 16 on the catch side. In this way, each of the pairs of catches is driven by a common crank drive.

Each catch 4 has a first slotted link, which consists of a first elongate hole arranged in curved manner in the catch and acting as first link guide and a journal 18 formed by the bush and acting as first link block. The curvature of the first elongate hole is located in the region of the open position of the catch. A second slotted link is, moreover, provided, the second link guide thereof being formed by second elongate holes 19 in metal sheets which are located in each case at the sides of the catches 4 remote from the crank drive. The metal sheets 20 additionally each have a bearing bore 21, in which the journals 18 formed by the bush 13 rotate. The second link blocks of the second slotted links are formed by extensions of the connecting rod shaft 16 on the catch side, with which the connecting rod 15 is coupled to the catches 4.

The curvature of the first link guide, together with the linear profile of the second link guide, brings about a pivoting movement of the catches 4 in the vicinity of the open position thereof about an axis running through the second link block. In another embodiment of the invention which is not shown, the second link guide has a curvature at its open position end which is a mirror image of the curvature of the first link guide. Then the catch 4 does not perform a pivoting movement, but rather a translational movement.

As is clear for example from a comparison of FIGS. 13 and 14, each catch 4 forms a toggle lever, wherein the first lever arm is formed by the section from the claw to the first link block and the second lever arm by the section from the first link block to the second link block. During travel from the open position to the locking position, the position of the first link block relative to the catch shifts such that the ratio between the first and second lever arms diminishes.

The invention enables an advantageously compact and simple design, which is capable of drawing the mating connector device reliably in and securing it. The large number of catches allows the forces to be uniformly distributed during locking, such that the mating connector device and indeed the mechanism according to the invention may be of less solid and therefore of lighter construction. The mechanism according to the invention is moreover simple to assemble; for instance, the locking unit consisting of pair of catches 4, crank drive and slotted links may be simply pushed onto the shaft and simply positioned at the required point depending on the embodiment of the connector device. Replacement in case of repair is also correspondingly simple.

The features disclosed in the above description, the claims and the drawings may be of significance for implementation of the invention in its various embodiments either individually or in any desired combination.

LIST OF REFERENCE SIGNS

1 Mechanism
2 Receiver frame
3 Frame of interchangeable test adapter
4 Catch
5 Upper edge
6 Lower edge
7 Claw
8 Hole
9 Mating catch
10 Through-hole
11 Finger
12 Recess
13 Bush
14 Crank arm
15 Connecting rod
16 Catch-side connecting rod shaft
17 First elongate hole
18 Journal
19 Second elongate hole
20 Metal sheets
21 Bearing bore

The invention claimed is:

1. A mechanism for securing a connector device and a mating connector device to one another and for releasing them from one another, the mechanism comprising:
at least one catch arranged on the connector device and a drive with a shaft, wherein rotation of the shaft is capable of moving the catch to and fro between an open position and a locking position of the catch; and
a first slotted link for guiding the catch, wherein a link guide of the first slotted link is arranged on the catch, wherein a link block of the first slotted link lies on the axis of the shaft or is formed by the shaft, and
wherein the mechanism is constructed such that, during travel between the open position and the locking position, the catch performs a combined pivoting and translational movement, and/or a translational movement on a curved path.

2. The mechanism according to claim 1, wherein the mechanism is constructed such that the pivoting movement of the catch proceeds about a pivot axis which extends substantially perpendicular to a plug-in direction.

3. The mechanism according to claim 1, wherein the drive comprises a crank drive for converting the rotation of the shaft into movement of the catch between the open position and the locking position.

4. The mechanism according to claim 3, further comprising a plurality of catches, wherein at least two catches are driven by the same crank drive.

5. The mechanism according to claim 1, wherein the drive comprises a second slotted link for guiding the catch.

6. The mechanism according to claim 5, wherein the drive has a a crank drive for converting the rotation of the shaft into a movement of the catch between the open position and the locking position, wherein a link block of the second slotted link is formed by part of a connecting rod shaft on the catch side with which a connecting rod of the crank drive is coupled to the catch.

7. The mechanism according to claim 1, wherein the mechanism comprises a plurality of shafts.

8. A connector device with a mechanism according to claim 1.

9. A system including a connector device with a mechanism according to claim 1 and a mating connector device having at least one mating catch.

10. A mechanism for securing a connector device and a mating connector device to one another and for releasing them from one another, the mechanism comprising:
at least one catch arranged on the connector device;
a drive with a shaft, wherein the rotation of the shaft is capable of moving the catch to and fro between an open position and a locking position of the catch; and
a slotted link with a link guide and a link block,
wherein the link guide is arranged on the catch and the link block lies on the axis of the shaft or is formed by the shaft.

11. The mechanism according to claim 10, wherein the catch has a claw for engaging with a mating catch of the mating connector device and, in relation to the longitudinal extent thereof, is guided at at least two different points in each case by one or more journals, wherein the position, again in relation to the longitudinal extent of the catch, of the or at least one of the plurality of journals changes during travel between the open position and the locking position, such that there is a change in the ratio of the length of a lever on the claw side, which lever is formed by the portion of the catch between the claw and the journal closest to the claw, to the length of a lever remote from the claw, which lever is formed by the portion of the catch between said journal and the journal further away from the claw.

12. A connector device with a mechanism according to claim 10.

13. A system including a connector device with a mechanism according to claim 10 and a mating connector device having at least one mating catch.

14. A mechanism for securing a connector device and a mating connector device to one another and for releasing them from one another, the mechanism comprising:
- at least one catch arranged on the connector device;
- a drive with a shaft, wherein rotation of the shaft is capable of moving the catch to and fro between an open position and a locking position of the catch, wherein the drive has a crank drive for converting the rotation of the shaft into a movement of the catch between the open position and the locking position;
- a second slotted link for guiding the catch,
- wherein a link block of the second slotted link is formed by part of a connecting rod shaft on the catch side with which a connecting rod of the crank drive is coupled to the catch.

15. A connector device with a mechanism according to claim 14.

* * * * *